(12) United States Patent
Priel et al.

(10) Patent No.: US 7,786,809 B1
(45) Date of Patent: Aug. 31, 2010

(54) METHOD OF LOW POWER PLL FOR LOW JITTER DEMANDING APPLICATIONS

(75) Inventors: Michael Priel, Herzlya (IL); Lavi Koch, Jerusalem (IL); Sanjay Wadhwa, Noida (IN)

(73) Assignee: Freescale, Austin, TX (US)

( * ) Notice: Subject to any disclaimer, the term of this patent is extended or adjusted under 35 U.S.C. 154(b) by 345 days.

(21) Appl. No.: 12/041,687

(22) Filed: Mar. 4, 2008

(51) Int. Cl.
*H03L 7/00* (2006.01)

(52) U.S. Cl. .................. 331/16; 331/34; 331/177 R; 331/175; 331/1 A; 327/156

(58) Field of Classification Search ............... 331/1 A, 331/16, 34, 177 R, 175; 327/156
See application file for complete search history.

(56) References Cited

U.S. PATENT DOCUMENTS 6,633,190 B1 * 10/2003 Alvandpour et al. ........ 327/291
7,148,760 B2    12/2006 Vaananen

* cited by examiner

*Primary Examiner*—Arnold Kinkead
(74) *Attorney, Agent, or Firm*—Reches Patents

(57) ABSTRACT

A system that includes a phase locked loop and an activation circuit; wherein the phase locked loop includes an oscillator, a frequency divider, a phase detector, a control circuit, and a memory circuit. The activation circuit is adapted to activate the memory circuit and the oscillator; to deactivate the frequency divider, the phase detector and the control circuit during deactivation periods and to activate the frequency divider, the phase detector and the control circuit during activation periods. The timing relationship between a deactivation period and an activation period is responsive to an output signal jitter limitation and to a power consumption limitation.

20 Claims, 7 Drawing Sheets

102

US 7,786,809 B1

METHOD OF LOW POWER PLL FOR LOW JITTER DEMANDING APPLICATIONS

FIELD OF THE INVENTION

The present invention relates to a system that includes a phase locked loop and to a method for reducing power consumption of a phase locked loop.

BACKGROUND OF THE INVENTION

A phase locked loop (PLL) generates a periodical output signal. This output signal is responsive to a reference signal. A PLL can reconstruct a reference clock signal, can divide a reference clock signal or multiply a reference clock signal.

FIG. 1 illustrates prior art PLL 10. PLL 10 includes oscillator 20, frequency divider 30, phase detector 40 and control circuit 50. Oscillator 20 is connected to control circuit 50 and to frequency divider 30. Phase detector 40 is connected between frequency divider 30 and control circuit 50.

Oscillator 20 oscillates to provide output signal So 22 having output frequency Fo 24 in response to a control signal Sc 52 provided by control circuit 50. Frequency divider 30 generates a feedback signal Sf 32 that has a feedback frequency Ff 34 that can be a fraction of output frequency Fo 24. Phase detector 40 receives feedback signal Sf 32 and reference signal Sr 12 and outputs phase error signal Spe 42 that represents a phase difference between feedback signal Sf 32 and reference signal Sr 12. Control circuit 50 receives phase error signal Spe 42 and generates control signal Sc 52.

The power consumption of PLL 10 is responsive to output frequency Fo 24. When output frequency Fo 24 is high PLL 10 consumes a substantial amount of power. This power consumption empties a power source that supplies power to PLL 10.

locked loop

SUMMARY OF THE PRESENT INVENTION

The present invention provides a method and a system as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF PREFERRED EMBODIMENTS

Figure 1:
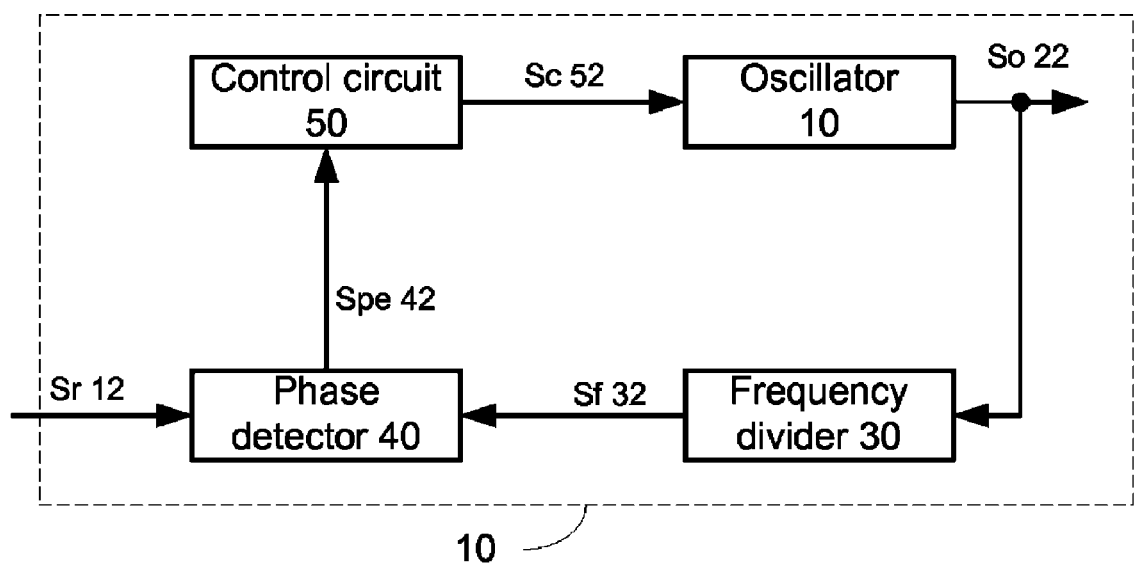
FIG. 1 illustrates a prior art phase locked loop.
Figure 2:
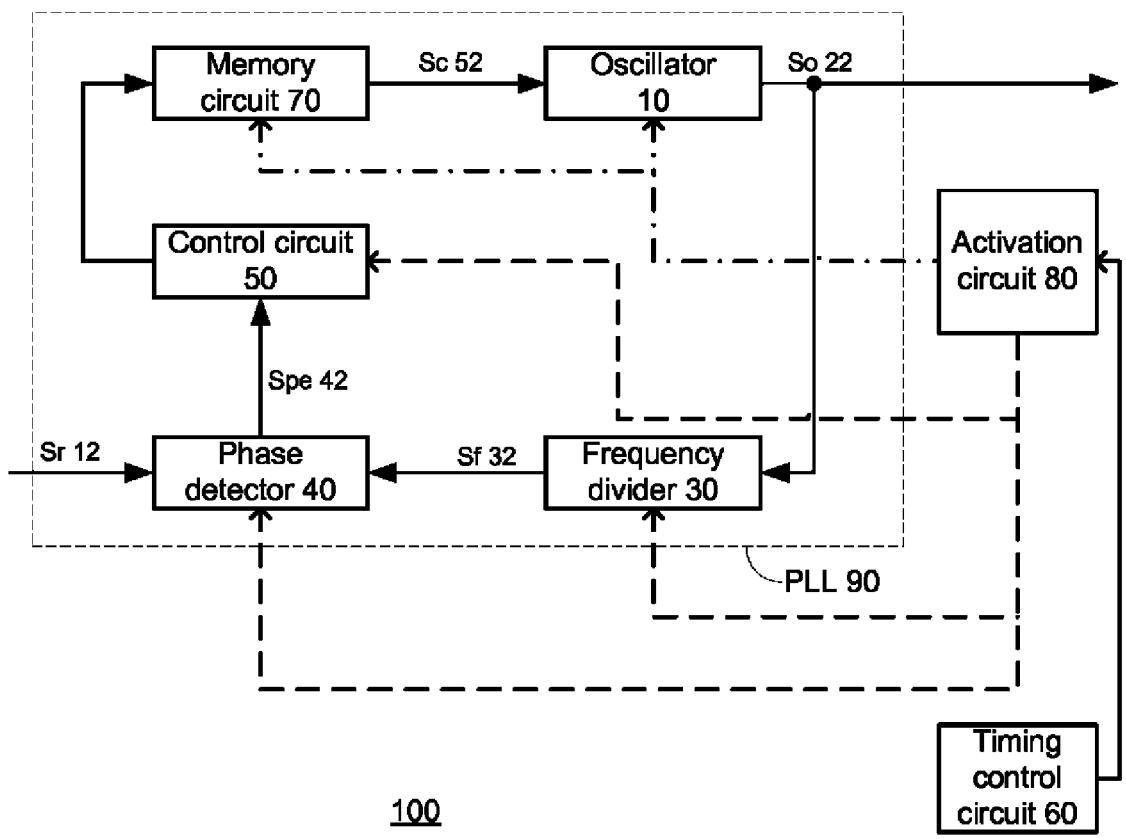
FIG. 2 schematically shows an example of an embodiment of a system.

FIG. 2 illustrates system 100. System 100 includes PLL 90 and activation circuit 80. PLL 90 includes oscillator 20, frequency divider 30, phase detector 40, control circuit 50 and memory circuit 70. Memory circuit 70 is connected between oscillator 20 and control circuit 50. Memory circuit 70 stores a control signal Sc 52 that is provided by control circuit 50 and sends this control signal to oscillator 20. Frequency divider 30, phase detector 40 and control circuit 50 form a feedback loop of PLL 90.

When all components of PLL 90 are activated PLL 90 operates in a locked mode. During this mode memory unit 70 operates in a transparent manner as it passes to oscillator 20 control signals generated by control circuit 50 and erases previous control signals.

When PLL 90 operates at an unlocked mode the last control signal that was provided to memory circuit 70 during a previous activation period is provided to oscillator 20. Because the PLL feedback loop is disabled output signal So 22 becomes jittered.

Activation circuit 80 is adapted to: (i) activate memory circuit 70 and oscillator 20, (ii) deactivate frequency divider 30, phase detector 40 and control circuit 50 during deactivation periods, and (iii) activate frequency divider 30, phase detector 40 and control circuit 50 during activation periods.

It is noted that a timing relationship between a deactivation period (out of the multiple deactivation periods mentioned above) and an activation period (out of the multiple activation periods mentioned above) is responsive to an output signal jitter limitation and to a power consumption limitation.

Conveniently, the different deactivation periods can be of equal duration but this is not necessarily so. Conveniently, the different activation periods can be of equal duration but this is not necessarily so.

Conveniently, an output signal jitter level is measured after a predetermined period from the beginning of a deactivation period and system 100 determines whether to end the deactivation period or not.

The timing relationship can be determined by system 100 and especially by timing control circuit 60. Timing control circuit 60 can be connected to activation circuit 80 (as illustrated in FIG. 2) or be included within activation circuit 80.

The timing relationship can be determined during a design phase of system 100. For example, if PLL 90 is used to provide a clock signal to a digital circuit that can tolerate a certain amount of output signal jitter then the timing relationship can be set in view of that certain amount of jitter and in view of one or more power reduction limitations. It is noted that the timing relationship can remain unchanged during the lifespan of system 100 but this is not necessarily so.

According to various embodiments of the invention the timing relationship can be altered. The alteration can be responsive to the application being executed by a circuit that is fed by the output signal, and additionally or alternatively by output signal jitter indications, by temperature (or supply voltage) changes and the like.

Conveniently, timing control circuit 60 is adapted to determine a duration of a deactivation period in response to relationship between a maximal allowable output signal jitter level and an output signal jitter level expected to be developed during the deactivation period.

Timing control circuit 60 can set an upper limit to the duration of the deactivation period so as to prevent the output signal jitter level to exceed the maximal allowable output signal jitter level. The duration of the deactivation period can also be responsive to power reduction limitations. Power reduction is responsive (and even proportional) to the duration of the deactivation period. Longer deactivation periods lead to reduced power consumption.

Conveniently, timing control circuit 60 determines deactivation periods of equal duration and activation periods of equal duration.

According to another embodiment of the invention an output signal jitter level is measured after a predefined time lapses from a beginning of a deactivation period. The determination of whether to continue the deactivation period or to terminate it is responsive to the measured output signal jitter level. It is noted that the next measurement (if such a measurement is required) can be executed after another period expired. It is noted that the duration of the other period can be dependent upon the measured output signal jitter level. For example, higher measured output signal jitter level can mandate a shorter [deactivation] period.

According to another embodiment of the invention the system does not determine the timing relationship but rather receives timing relationship information representative of the timing relationship. System 100 receives timing relationship information that determines the activation and deactivation of PLL components by activation circuit 80.

Conveniently, the output signal jitter level is measured. An output signal jitter indication that reflects the result of the measurement can be provided to timing control circuit 60. Timing control circuit 60 can (in response to the output jitter indication) evaluate the timing relationship. For example, if the output signal jitter level is low (especially lower than a predefined limit) then timing control circuit 60 can extend the duration of a deactivation period. The predefined limit can be the maximal allowable output signal jitter level or a fraction thereof.

Figure 3:
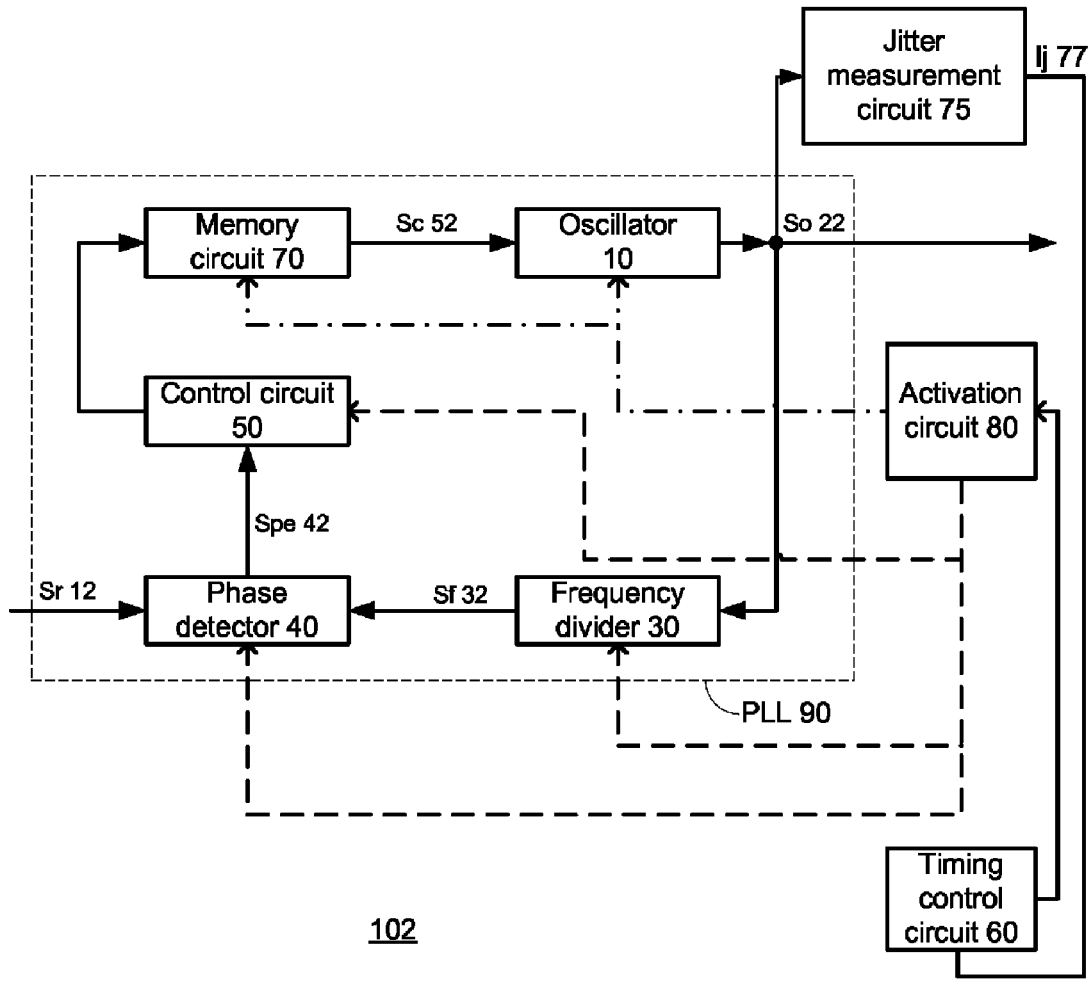
FIG. 3 schematically shows an example of an embodiment of a system.

FIG. 3 illustrates system 102 that includes jitter measurement circuit 75. Jitter measurement circuit 75 measures the jitter of output signal So 22 to provide output signal jitter indication (denoted Ij) 77.

Figure 4:
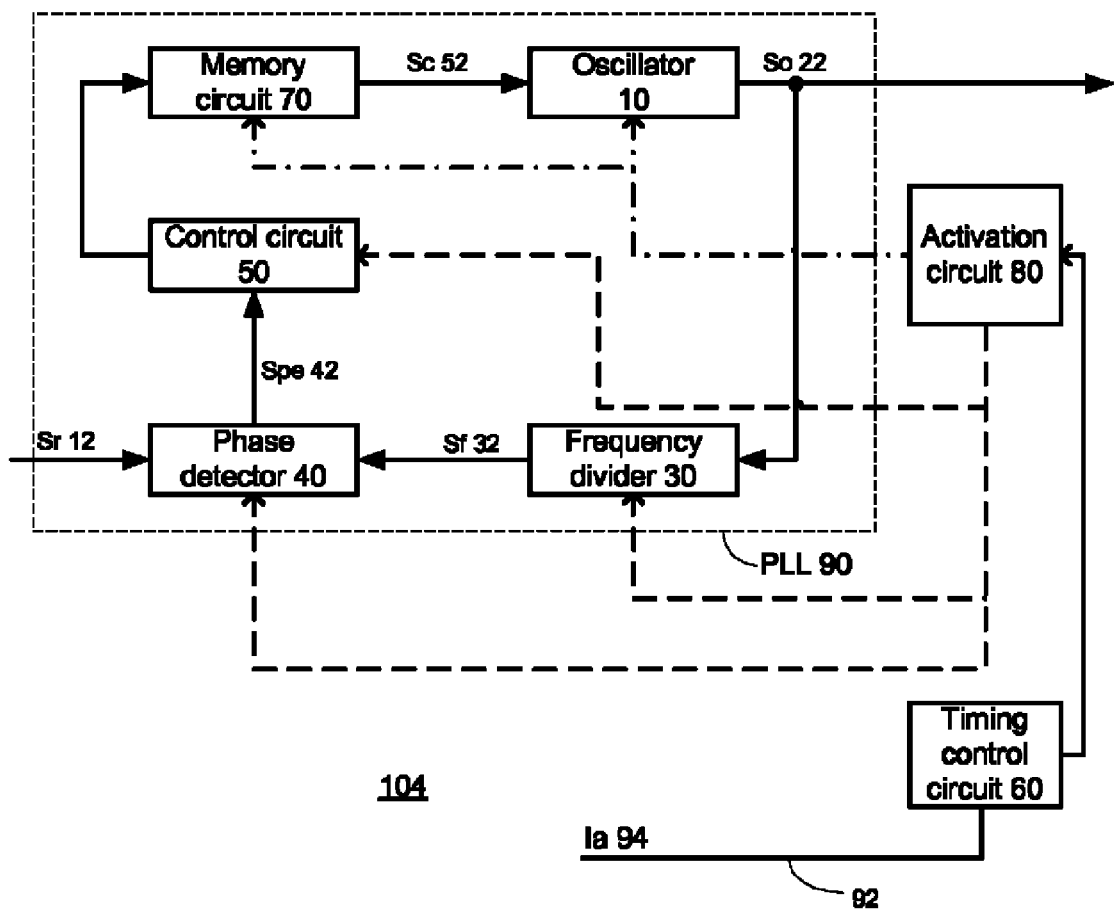
FIG. 4 schematically shows an example of an embodiment of a system.

Conveniently, timing control circuit 60 is adapted to determine the relationship between a deactivation period and an activation period in response to a jitter level associated with an application that is executed by utilizing the output signal. FIG. 4 illustrates system 104 that includes control line 92 through which application indication (Ia 94) is provided.

It is noted that the timing relationship can be determined in view of output signal jitter indication and in view of the application indication.

Oscillator 20 can be a voltage controlled oscillator (VCO), a current controlled oscillator (ICO), an LC tank oscillator, or a digitally controlled oscillator (DCO).

Activation circuit 80 activates memory circuit 70 and oscillator 20 by providing a high frequency clock signal and a supply voltage. Activation circuit 80 can deactivate frequency divider 30, phase detector 40 and control circuit 50 by not supplying power and, additionally or alternatively by not supplying a clock signal.

Figure 5:
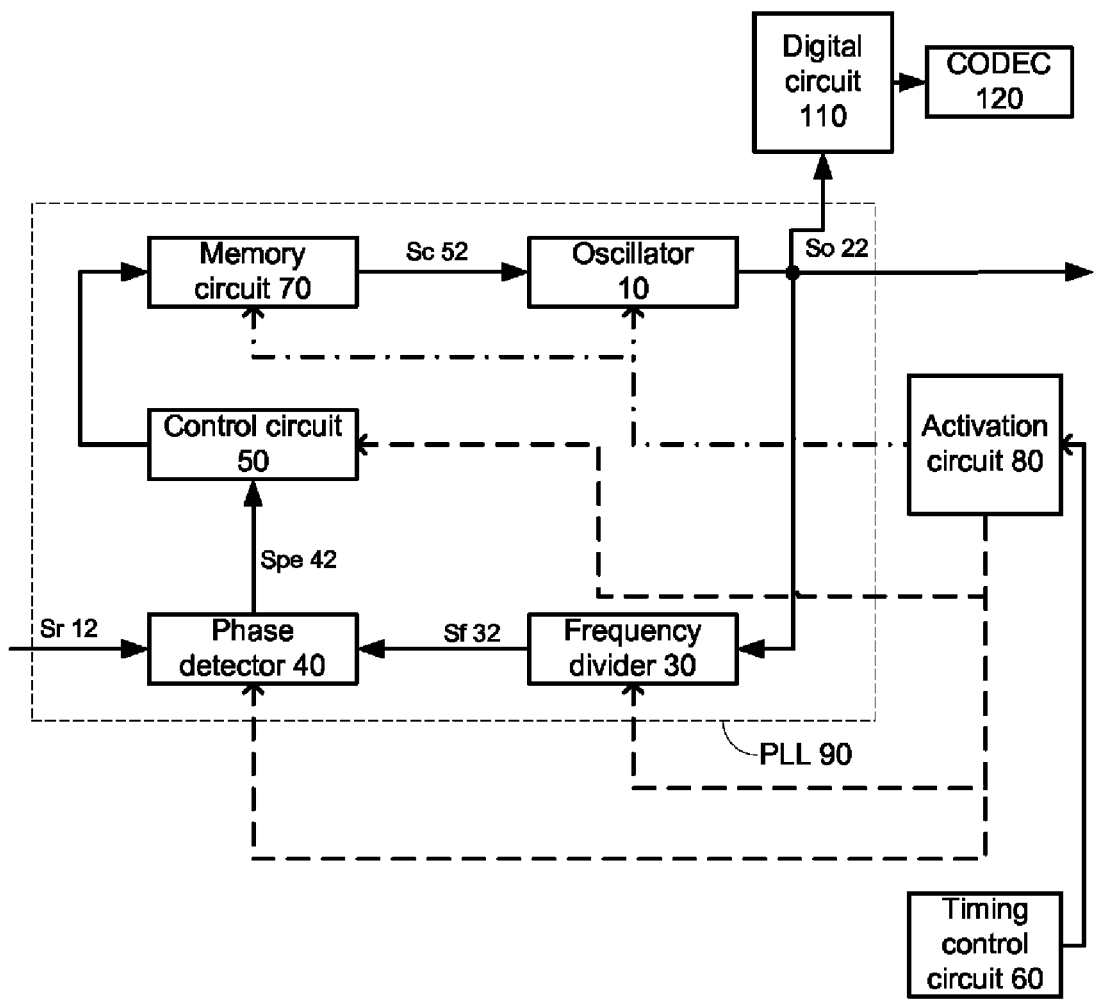
FIG. 5 schematically shows an example of an embodiment of a system.

PLL 90 can be used for various purposes. FIG. 5 illustrates system 106 in which PLL 90 supplies output signal So 22 to digital circuit 110 that is connected to a mixed signal circuit such as but not limited to codec 120.

Figure 6:
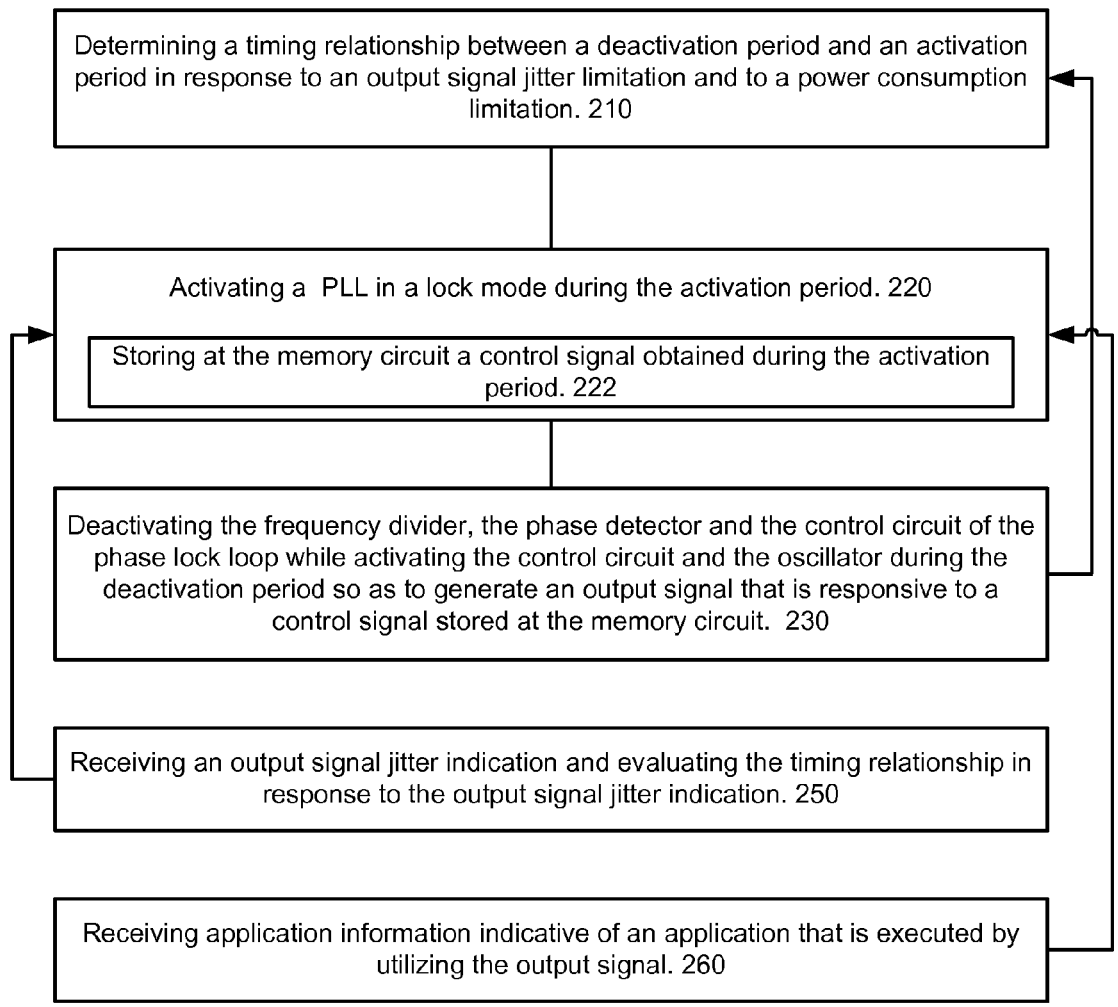
FIG. 6 schematically shows an example of an embodiment of a method.

FIG. 6 is a flow chart of method 200 for power consumption reduction according to an embodiment of the invention.

Method 200 starts by stage 210 of determining a timing relationship between a deactivation period and an activation period in response to an output signal jitter limitation and to a power consumption limitation.

Stage 210 conveniently includes determining a duration of the deactivation period in response to a relationship between a maximal allowable output signal jitter level and output signal jitter level expected to be developed during the deactivation period.

Conveniently, stage 210 can include automatically setting a "deactivation period" according to requirements of power consumption reduction.

Stage 210 is followed by stage 220 of activating PLL 90 in a lock mode during the activation period. Especially, a frequency divider, a phase detector, a control circuit, an oscillator and a memory circuit are activated.

Stage 220 includes stage 222 of storing at the memory circuit a control signal obtained during the activation period. It is noted that during the activation period multiple control signals are generated. The memory circuit operates in a transparent manner as each newly generated control signal is sent to oscillator and also replaced a previously stored control signal.

Stage 220 is followed by stage 230 of deactivating the frequency divider, the phase detector and the control circuit of the phase locked loop while activating the control circuit and the oscillator during the deactivation period so as to generate an output signal that is responsive to a control signal stored at the memory circuit. Stage 230 can include clock [and/or power] gating.

Stage 230 can be followed by stage 220 or can be followed by stage 210. Conveniently, few iterations of stages 220 and 230 are followed by stage 210. Yet according to another embodiment of the invention stage 230 is always followed by stage 220.

It is noted that during stages 220 and 230 an output signal is provided. The output signal jitter level is lower during stage 220. Conveniently, method 200 includes stage 290 of supplying the output signal to a digital circuit that is connected to a mixed signal circuit such as but not limited to a codec.

Method 200 can include optional stages 250 and 260. Stage 250 includes receiving an output signal jitter indication and evaluating the timing relationship in response to the output signal jitter indication. Stage 250 is followed by stage 220.

Stage 260 includes receiving application information indicative of an application that is executed by utilizing the output signal. Stage 260 is followed by stage 210 wherein the determination of the timing information is done in response to the application information.

Figure 7:
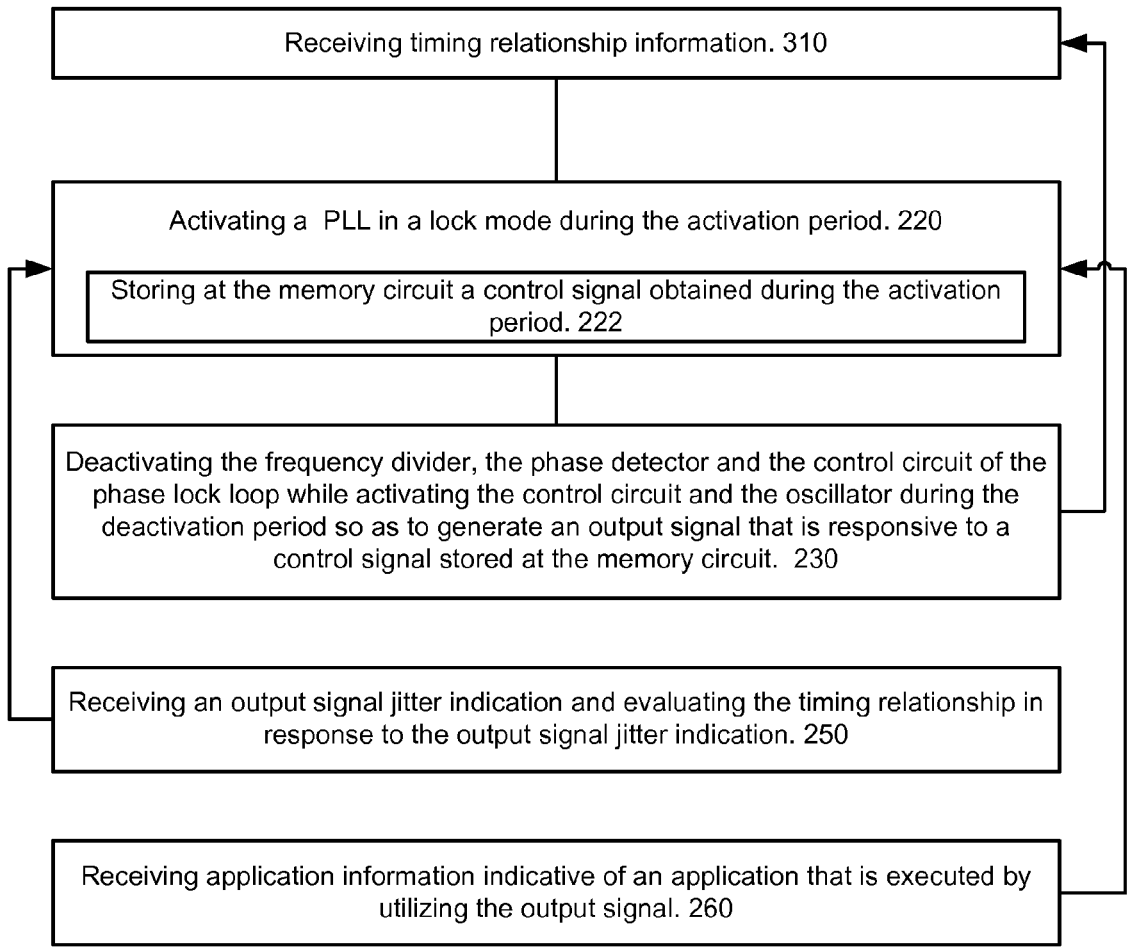
FIG. 7 schematically shows an example of an embodiment of a method.

FIG. 7 is a flow chart of method 300 for power consumption reduction according to an embodiment of the invention. Method 300 differs from method 200 by including stage 310 instead of stage 210.

Stage 310 includes receiving timing relationship information. Stage 310 is followed by stages 220 and 230. Stage 230 can be followed by stage 220 or 310.

By now it should be appreciated that there has been provided a system that includes a PLL and a method for power reduction of a PLL.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

We claim:

1. A system comprising a phase locked loop and an activation circuit;
    wherein the phase locked loop comprises:
        an oscillator adapted to output an output signal having an output frequency in response to a control signal;
        a frequency divider, coupled to the oscillator, adapted to generate a feedback signal that has a feedback frequency that is a fraction of the output frequency;
        a phase detector, coupled to the frequency divider and to a reference signal source, adapted to output a phase error signal that represents a phase difference between the feedback signal and the reference signal;
        a control circuit, adapted to receive the phase error signal and to generate the control signal;
        a memory circuit, adapted to store the control signal; and
        an activation circuit, adapted to activate the memory circuit and the oscillator; and to deactivate the frequency divider, the phase detector and the control circuit during deactivation periods and to activate the frequency divider, the phase detector and the control circuit during activation periods;
    wherein a timing relationship between a deactivation period and an activation period is responsive to an output signal jitter limitation and to a power consumption limitation.

2. The system according to claim 1 comprising a timing control circuit that is adapted to determine the timing relationship.

3. The system according to claim 2 wherein the timing control circuit is adapted to determine a duration of a deactivation period in response to relationship between a maximal allowable output signal jitter level and output signal jitter level expected to be developed during the deactivation period.

4. The system according to claim 2 wherein the timing control circuit is adapted to receive an output signal jitter indication and evaluate the timing relationship in response to the output signal jitter indication.

5. The system according to claim 1 comprising a timing control circuit that is adapted to receive timing relationship information and in response to the timing relationship information deactivate the frequency divider, the phase detector and the control circuit during the deactivation period and activate the frequency divider, the phase detector and the control circuit during the activation period.

6. The system according to claim 2 wherein the timing control circuit is adapted to determine the relationship between a deactivation period and an activation period in response to a jitter level associated with an application that is executed by utilizing the output signal.

7. The system according to claim 1 wherein the activation circuit is adapted to deactivate the frequency divider, the phase detector and the control circuit during deactivation periods of equal duration and wherein the activation circuit is adapted to activate the frequency divider, the phase detector and the control circuit during activation periods of equal duration.

8. The system according to claim 1 wherein the oscillator is selected from a list consisting of a voltage controlled oscillator, a current controlled oscillator, an LC tank oscillator and a digitally controlled oscillator and wherein the activation circuit activates the memory circuit and the oscillator by providing a high frequency clock signal and a supply voltage.

9. The system according to claim 1 wherein the phase locked loop generates an output signal that is utilized by a digital circuit that is coupled to a mixed signal circuit.

10. The system according to claim 1 comprising a codec that is coupled to a digital circuit that receives the output signal.

11. A method for power consumption reduction, the method comprises:
    storing at a memory circuit a control signal obtained during an activation period of a frequency divider, a phase detector and a control circuit of a phase locked loop;
    deactivating the frequency divider, the phase detector and the control circuit of the phase locked loop while activating the control circuit and the oscillator during a deactivation period that follows the activation period so as to generate an output signal that is responsive to a control signal stored at the memory circuit;
    wherein a timing relationship between the deactivation period and the activation period is responsive to an output signal jitter limitation and to a power consumption limitation.

12. The method according to claim 11 comprising determining the timing relationship.

13. The method according to claim 12 comprising determining a duration of the deactivation period in response to a relationship between a maximal allowable output signal jitter level and output signal jitter level expected to be developed during the deactivation period.

14. The method according to claim 12 comprising receiving an output signal jitter indication and evaluating the timing relationship in response to the output signal jitter indication.

15. The method according to claim 12 comprising receiving timing relationship information.

16. The method according to claim 12 comprising receiving a application information indicative of an application that is executed by utilizing the output signal; and in response to the application information determining the timing relationship.

17. The method according to claim 12 comprising deactivating the frequency divider, the phase detector and the control circuit during deactivation periods of equal duration and activating the frequency divider, the phase detector and the control circuit during activation periods of equal duration.

18. The method according to claim 12 wherein the deactivation comprising clock gating or power gating.

19. The method according to claim 12 comprising supplying the output signal to a digital circuit that is coupled to a mixed signal circuit.

20. The method according to claim 12 comprising supplying the output signal to a digital circuit that is coupled to a codec.

* * * * *